(12) United States Patent
Chen et al.

(10) Patent No.: US 8,569,127 B2
(45) Date of Patent: Oct. 29, 2013

(54) SEMICONDUCTOR DEVICE AND METHOD FOR FABRICATING THE SAME

(75) Inventors: Chien-Yang Chen, Kaohsiung (TW); Chen-Hua Tsai, Hsinchu County (TW); Shih-Fang Hong, Tainan (TW); Po-Chao Tsao, New Taipei (TW); Ming-Te Wei, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/418,835

(22) Filed: Mar. 13, 2012

(65) Prior Publication Data
US 2013/0241001 A1 Sep. 19, 2013

(51) Int. Cl.
*H01L 21/8238* (2006.01)
*H01L 21/00* (2006.01)

(52) U.S. Cl.
USPC .......... 438/210; 438/171; 438/190; 438/238; 257/E21.001

(58) Field of Classification Search
USPC .......................................... 438/210, 689–755
See application file for complete search history.

(56) References Cited

U.S. PATENT DOCUMENTS

| | | | | |
|---|---|---|---|---|
| 5,953,612 A * | 9/1999 | Lin et al. | | 438/299 |
| 6,074,921 A * | 6/2000 | Lin | | 438/299 |
| 6,143,613 A * | 11/2000 | Lin | | 438/299 |
| 6,207,543 B1 * | 3/2001 | Harvey et al. | | 438/586 |
| 6,300,180 B1 * | 10/2001 | Chang et al. | | 438/210 |
| 6,420,273 B1 * | 7/2002 | Lin | | 438/706 |
| 7,659,176 B2 * | 2/2010 | Coolbaugh et al. | | 438/385 |
| 7,749,822 B2 * | 7/2010 | Freeman et al. | | 438/155 |
| 7,994,576 B2 * | 8/2011 | Tseng et al. | | 257/350 |
| 8,030,738 B2 * | 10/2011 | Shin | | 257/538 |
| 8,154,085 B2 * | 4/2012 | Ishibashi | | 257/380 |
| 8,252,657 B2 * | 8/2012 | Tseng et al. | | 438/382 |
| 8,377,763 B2 * | 2/2013 | Kanike | | 438/155 |
| 2004/0150507 A1 * | 8/2004 | Olson | | 338/309 |
| 2007/0096183 A1 * | 5/2007 | Ogawa et al. | | 257/300 |
| 2007/0181954 A1 * | 8/2007 | Oikawa | | 257/382 |
| 2009/0278189 A1 * | 11/2009 | Cho et al. | | 257/316 |
| 2009/0286378 A1 * | 11/2009 | Hase | | 438/382 |
| 2010/0167485 A1 * | 7/2010 | Wang et al. | | 438/299 |
| 2011/0057267 A1 * | 3/2011 | Chuang et al. | | 257/380 |
| 2011/0186916 A1 * | 8/2011 | Kurz et al. | | 257/288 |
| 2011/0309433 A1 * | 12/2011 | Shin | | 257/324 |
| 2012/0178234 A1 * | 7/2012 | Lee et al. | | 438/382 |
| 2013/0015530 A1 * | 1/2013 | Kim et al. | | 257/380 |
| 2013/0149849 A1 * | 6/2013 | Nandakumar | | 438/532 |

* cited by examiner

*Primary Examiner* — Seahvosh Nikmanesh
*Assistant Examiner* — Evren Seven
(74) *Attorney, Agent, or Firm* — J.C. Patents

(57) ABSTRACT

A method for fabricating a semiconductor device is described. A substrate having thereon a polysilicon resistor is provided. A dielectric layer is formed over the substrate covering the polysilicon resistor. The dielectric layer is etched to form a contact opening over the polysilicon resistor, with overetching into the polysilicon resistor. A metal silicide layer is formed on the polysilicon resistor in the contact opening. A metal material is filled in the contact opening. A portion of the dielectric layer, the metal material, and a portion of the polysilicon resistor are removed to expose the metal silicide layer. A metal contact is formed over the metal silicide layer.

12 Claims, 2 Drawing Sheets

SEMICONDUCTOR DEVICE AND METHOD FOR FABRICATING THE SAME

BACKGROUND OF THE INVENTION

1. Field of Invention

This invention relates to a semiconductor device and a method for fabricating the semiconductor device.

2. Description of Related Art

The semiconductor devices in an integrated circuit usually include metal-oxide-semiconductor (MOS) transistors and polysilicon resistors, wherein the gates of the MOS transistors and the polysilicon resistors are usually at the same level.

A method for fabricating such an integrated circuit includes the following steps. After contact openings are formed over the source/drain (S/D) regions, a metal salicide (self-aligned silicide) layer is formed on the S/D regions in the contact openings, and then the contact openings are filled by a metal material to form S/D contacts. M0 metal contacts are then formed to contact the gates of the MOS transistors, the S/D contacts and the polysilicon resistors.

Because a metal salicide layer is not formed on the polysilicon resistors, the M0 metal contacts over the polysilicon resistors directly contact the polysilicon resistors. Thus, the contact sheet resistance between a polysilicon resistor and the corresponding M0 metal contact is large.

SUMMARY OF THE INVENTION

Accordingly, this invention provides a method for fabricating a semiconductor device, which can reduce the contact sheet resistance between a polysilicon resistor and the corresponding metal contact.

This invention also provides a semiconductor device that is fabricated using the method of this invention.

The method for fabricating a semiconductor device of this invention is described below. A substrate having thereon a polysilicon resistor is provided. A dielectric layer is formed over the substrate covering the polysilicon resistor. The dielectric layer is etched to form a contact opening over the polysilicon resistor, with overetching into the polysilicon resistor. A metal silicide layer is formed on the polysilicon resistor in the contact opening. A metal material is filled in the contact opening. A portion of the dielectric layer, the metal material, and a portion of the polysilicon resistor are removed to expose the metal silicide layer. A metal contact is then formed over the metal silicide layer.

The above process can be integrated with a contact process of a MOS transistor. In the integrated process, the substrate provided further has thereon a gate and S/D regions beside the gate, the dielectric layer formed over the substrate further covers the gate and the S/D regions, additional contact openings are formed over the S/D regions by etching the dielectric layer, the metal silicide layer is also formed on the S/D regions in the additional contact openings, the metal material is also filled in the additional contact openings, portions of the metal material remain in the additional contact openings over the S/D regions to serve as S/D metal contacts, and additional metal contacts are formed over the gate and the S/D metal contacts.

The semiconductor device of this invention includes a polysilicon resistor, a first metal contact on the polysilicon resistor, and a first metal silicide layer disposed and electrically connected between the polysilicon resistor and the first metal contact.

With the integration of a contact process of a MOS transistor, the semiconductor device can further include a gate, S/D regions beside the gate, S/D metal contacts on the S/D regions, a second metal silicide layer disposed between the S/D regions and the S/D metal contacts and formed simultaneously with the first metal silicide layer, and second metal contacts disposed on the S/D metal contacts and the gate of the MOS transistor and formed simultaneously with the first metal contact.

For a metal silicide layer is formed or disposed between the polysilicon resistor and the corresponding metal contact, the contact sheet resistance between the poly-Si resistor and the corresponding metal contact can be reduced.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit its scope. For example, though the substrate illustrated in the embodiment is a bulk substrate, it may alternatively be a semiconductor-on-insulator (SOI) substrate.

FIGS. 1A-1D illustrate, in a cross-sectional view, a method for fabricating a semiconductor device according to an embodiment of this invention.

Figure 1A:
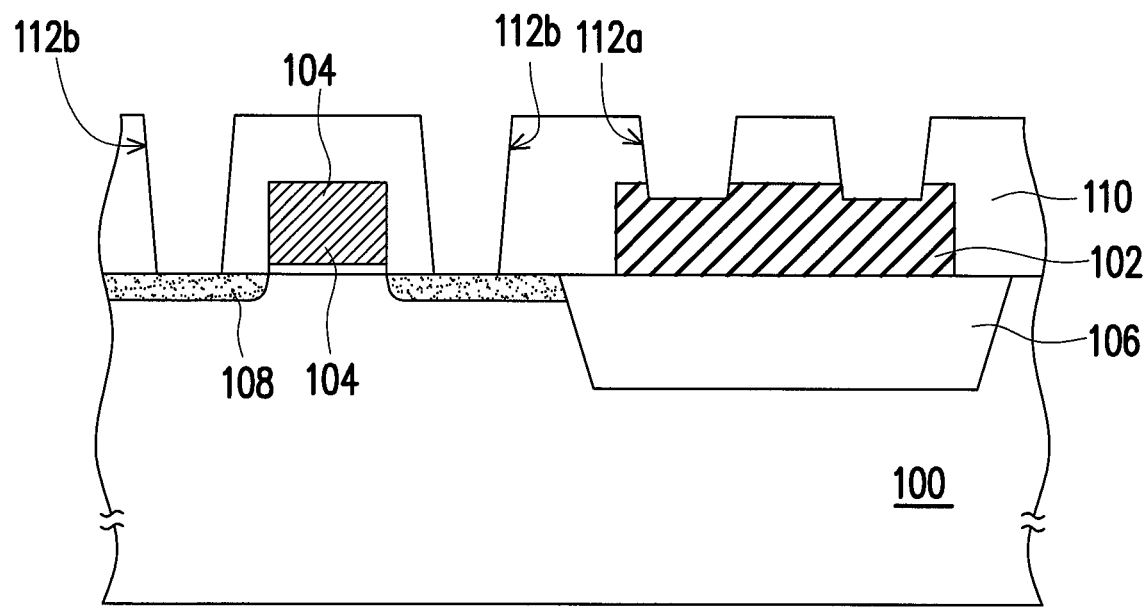
FIGS. 1A-1D illustrate, in a cross-sectional view, a method for fabricating a semiconductor device according to an embodiment of this invention, wherein FIG. 1D also illustrates a semiconductor device according to the embodiment.

Referring to FIG. 1A, a semiconductor substrate 100 is provided, having thereon a polysilicon resistor 102, and a gate 104 of a MOS transistor. The substrate 100 may include lightly doped single-crystal or epitaxial silicon. The polysilicon resistor 102 is usually formed on a device isolation layer 106, which may be a shallow trench isolation (STI) layer. The gate 104 may include metal or doped polysilicon, possibly disposed on a gate oxide layer or a high-K gate dielectric layer on the substrate 100. When the gate 104 is a metal gate, it may include a work-function metal layer and a low-resistance metal layer (not shown), and may have a liner layer and a spacer, etc., on the sidewall thereof (not shown). The S/D regions 108 of the MOS transistor are formed in the substrate 100 at both sides of the gate 104, possibly including silicon, or a semiconductor compound containing silicon.

Thereafter, a dielectric layer 110 is formed over the substrate 100 covering the polysilicon resistor 102, the gate 104 and the S/D regions 108. The dielectric layer 110 may include at least one dielectric film selected from a silicon oxide film, a silicon nitride (SiN) film, a SiC film, a SiCN film, a low-k material film and so on, and may be formed with PECVD or a spin-on glass (SOG) method, etc. A plurality of contact openings 112a and 112b are then formed in the dielectric layer 110 by anisotropic etching, wherein the contact openings 112a are formed over the polysilicon resistor 102 and the contact openings 112b formed over the S/D regions 108, and overetching into the polysilicon resistor 102 occurs in the corresponding contact openings 112a due to the higher top surface of the polysilicon resistor 102. The number of the contact openings 112a is not limited to two. In addition, each of the contact openings 112a may have a slot shape in the top view.

Moreover, though overetching into the polysilicon resistor 102 occurs in the corresponding contact openings 112a due to the higher top surface of the polysilicon resistor 102 in the above embodiment, in another embodiment, such overetching may be prevented by forming a contact etching stop layer (CESL, not shown) covering the gate 104, the polysilicon resistor 102 and so on before the dielectric layer 110 is formed. In the forming process of the contact openings in such an embodiment, after the etching through the dielectric layer 110 is stopped by the CESL, the exposed portions of the CESL are removed possibly by wet etching.

Figure 1B:
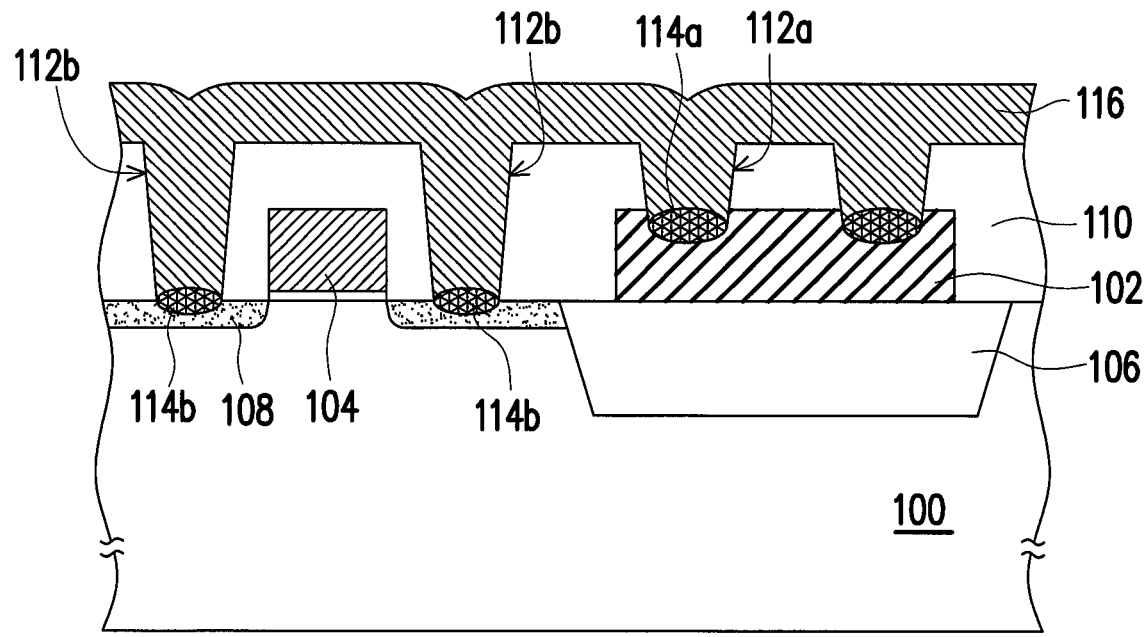

Referring to FIG. 1B, a metal silicide layer 114a/b is formed on the polysilicon resistor 102 and the S/D regions 108 in the contact openings 112a and 112b. The metal silicide layer 114a/b may include nickel silicide (NiSi), cobalt silicide (CoSi) or titanium silicide (TiSi), and may be formed with a self-aligned silicide (salicide) process. The salicide process typically includes depositing a metal, reacting the metal with the silicon in the polysilicon resistor 102 and the S/D regions 108, and removing the unreacted metal. Thereafter, a layer of a metal material 116 is formed filling up the contact openings 112a and 112b, possibly through sputtering. The metal material 116 may include tungsten, copper or any metal material with suitable resistance and gap-fill capability. In addition, a barrier layer (not shown), such as a TiN layer, can be formed between the metal material 116 and the dielectric layer 110, if required.

Figure 1C:
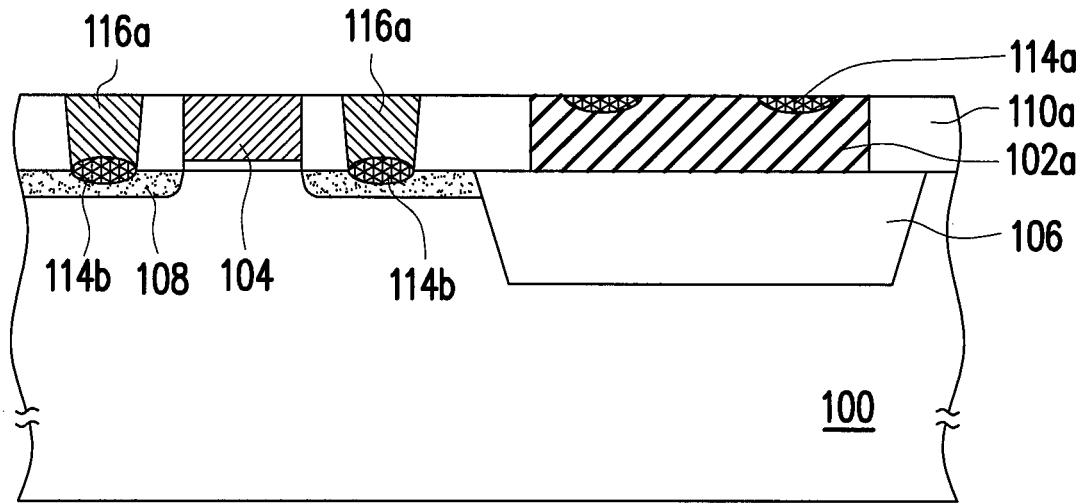

Referring to FIGS. 1B-1C, a portion of the metal material 116, a portion of the dielectric layer 110, a portion of the polysilicon resistor 102 and a portion of the gate 104 are removed to expose the metal silicide layer 114a on the polysilicon resistor 102 wherein portions of the metal material 116 remain in the contact openings 112b over the S/D regions 108 to serve as S/D metal contacts 116a. The removal process may include a planarization process, such as a chemical mechanical polishing (CMP) process. After the planarization process, the top surface of the remaining dielectric layer 110a, the top surface of the remaining gate 104, the top surfaces of the S/D metal contacts 116a and the top surface of the remaining polysilicon resistor 102a are substantially coplanar with each other.

Figure 1D:
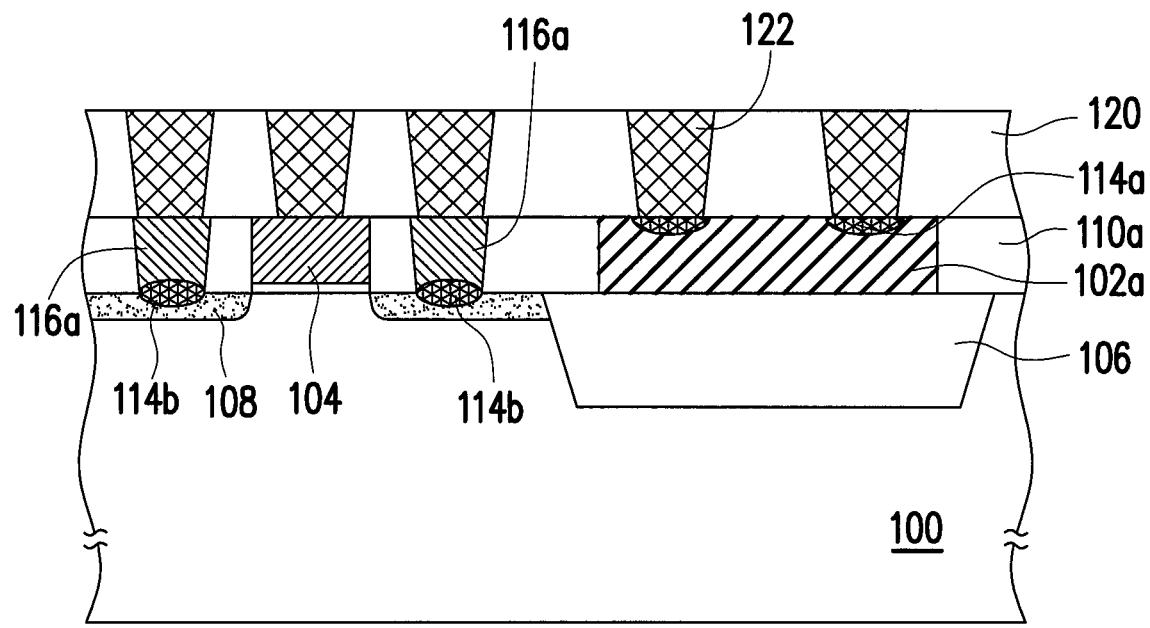

Referring to FIG. 1D, another dielectric layer 120 is formed over the resulting structure, and then a plurality of metal contacts 122 are formed respectively over the metal silicide layer 114a on the polysilicon resistor 102, over the gate 104, and over the S/D metal contacts 116a. The metal contacts 122 may include tungsten, copper or any metal material with suitable resistance and gap-fill capability, and may be formed by etching the dielectric layer 120 to form corresponding contact holes, depositing a metal material filling up the contact holes and then removing the metal material outside of the contact holes. In addition, a barrier layer (not shown), such as a TiN layer, can be formed between the metal contacts 122 and the dielectric layer 120, if required.

Moreover, though the dielectric layer 120 shown in FIG. 1D is directly formed over the previously resulting structure in the above embodiment, this invention is not limited thereto. For example, a relatively thin cap layer can be formed on the resulting structure prior to the dielectric layer 120. In the forming process of contact openings in such embodiment, after the etching through the dielectric layer 120 reaches the cap layer, the exposed portions of the cap layer can be removed by wet etching.

FIG. 1D also illustrates a semiconductor device according to this embodiment. The semiconductor device includes a polysilicon resistor 102a, a first metal contact 122 on the polysilicon resistor 102a, and a first metal silicide layer 114a disposed and electrically connected between the polysilicon resistor 102a and the first metal contact 122, and further includes a gate 104, S/D regions 108 in the substrate 100 at both sides of the gate 104, S/D metal contacts 116a on the S/D regions 108, a second metal silicide layer 114b disposed between the S/D regions 108 and the S/D metal contacts 116a and formed simultaneously with the first metal silicide layer 114a, and other second metal contacts 122 disposed on the S/D metal contacts 116a and the gate 104 and formed simultaneously with the first metal contact 122.

The polysilicon resistor 102 is usually disposed on a device isolation layer 106. The top surface of the gate 104, the top surfaces of the S/D metal contacts 116a and the top surface of the polysilicon resistor 102a may be substantially coplanar with each other. The material of each of the above parts of the semiconductor device can be the same as the corresponding material mentioned above.

Because a metal silicide layer is formed or disposed between the polysilicon resistor and the corresponding metal contact in the above embodiment, the contact sheet resistance between the polysilicon resistor and the corresponding metal contact can be reduced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:
   providing a substrate having thereon a polysilicon resistor;
   forming over the substrate a dielectric layer covering the polysilicon resistor;
   etching the dielectric layer to form a contact opening over the polysilicon resistor, with overetching into the polysilicon resistor;
   forming a metal silicide layer on the polysilicon resistor in the contact opening;
   filling a metal material in the contact opening;
   removing a portion of the dielectric layer, the metal material, and a portion of the polysilicon resistor to expose the metal silicide layer; and
   forming a metal contact over the metal silicide layer.

2. The method of claim 1, wherein the polysilicon resistor is disposed on a device isolation layer.

3. The method of claim 1, wherein the metal silicide layer comprises nickel silicide, cobalt silicide or titanium silicide.

4. The method of claim 1, wherein the metal material comprises tungsten or copper.

5. The method of claim 1, wherein the metal contact comprises tungsten or copper.

6. A method for fabricating a semiconductor device, comprising:
   providing a substrate having thereon a polysilicon resistor, a gate, and S/D regions beside the gate;
   forming over the substrate a dielectric layer covering the polysilicon resistor, the gate, and the S/D regions;
   etching the dielectric layer to form contact openings over the S/D regions and the polysilicon resistor;
   forming a metal silicide layer on the S/D regions and the polysilicon resistor in the contact openings;
   filling a metal material in the contact openings;
   removing a portion of the dielectric layer, a portion of the metal material, and a portion of the polysilicon resistor to expose the metal silicide layer on the polysilicon resistor, wherein portions of the metal material remain in the contact openings over the S/D regions to serve as S/D metal contacts; and forming metal contacts respectively over the metal silicide layer on the polysilicon resistor, over the gate, and over the S/D metal contacts.

7. The method of claim 6, wherein removing a portion of the dielectric layer, a portion of the metal material and a portion of the polysilicon resistor comprises performing a chemical mechanical polishing (CMP) process.

8. The method of claim 6, wherein the polysilicon resistor is disposed on a device isolation layer.

9. The method of claim 6, wherein the gate comprises metal or doped polysilicon.

10. The method of claim 6, wherein the metal silicide layer comprises nickel silicide, cobalt silicide or titanium silicide.

11. The method of claim 6, wherein the metal material comprises tungsten or copper.

12. The method of claim 6, wherein the metal contacts comprises tungsten or copper.

* * * * *